United States Patent
Ning

(10) Patent No.: US 6,635,546 B1
(45) Date of Patent: Oct. 21, 2003

(54) METHOD AND MANUFACTURING MRAM OFFSET CELLS IN A DAMASCENE STRUCTURE

(75) Inventor: X. J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/146,976

(22) Filed: May 16, 2002

(51) Int. Cl.⁷ .............................................. H01L 21/20
(52) U.S. Cl. ...................... 438/381; 438/238; 438/697
(58) Field of Search ................................ 438/238, 236, 438/381, 618, 627, 637, 692, 697, 700, 725, 728, 732, 734, 712

(56) References Cited

U.S. PATENT DOCUMENTS

| | | | |
|---|---|---|---|
| 5,693,568 A | * | 12/1997 | Liu et al. ................. 438/618 |
| 5,793,697 A | | 8/1998 | Scheuerlein |
| 5,838,608 A | | 11/1998 | Zhu et al. |
| 5,920,790 A | * | 7/1999 | Wetzel et al. ............. 438/618 |
| 5,986,925 A | | 11/1999 | Naji et al. |
| 6,081,445 A | | 6/2000 | Shi et al. |
| 6,104,633 A | | 8/2000 | Abraham et al. |
| 6,245,662 B1 | * | 6/2001 | Naik et al. ................. 438/622 |

* cited by examiner

Primary Examiner—David Nhu
(74) Attorney, Agent, or Firm—Slater & Matsil, L.L.P.

(57) ABSTRACT

A method of manufacturing an offset MRAM device (110), including utilizing two resist layers either to pattern a magnetic stack layer to form offset conductive lines (158) and magnetic memory cells (160), or to pattern an insulating layer to form vias (168) to expose magnetic memory cells and trenches (170) for conductive lines, or both, using a single etch process.

21 Claims, 4 Drawing Sheets

METHOD AND MANUFACTURING MRAM OFFSET CELLS IN A DAMASCENE STRUCTURE

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

In a cross-point MRAM device, the magnetic memory cells are located between two metal wiring levels. The bottom of the magnetic stacks make electrical contact to a lower wiring level, while the top of the magnetic stacks make electrical contact to an upper wiring level. An alternative MRAM design comprises an offset MRAM device.

In an offset MRAM, conductive lines comprising read lines and write lines are disposed within the same metallization layer. The read lines are connected to each magnetic memory cell. The write lines do not make direct contact to the magnetic memory cells, but rather, a magnetic field for the magnetic memory cells is induced by running electric current through the write lines, which are disposed proximate the magnetic memory cells, in order to influence the magnetic spin direction of the magnetic memory cell, thus writing to the cell.

SUMMARY OF THE INVENTION

Preferred embodiments of the present invention achieve technical advantages as a method of manufacturing MRAM offset magnetic memory cells, using double resist layers to pattern either a magnetic stack layer or insulating layer, or both, reducing the number of process steps.

In one embodiment, a method of manufacturing a resistive semiconductor memory device is disclosed. The method includes forming a plurality of first conductive lines, depositing a first insulating layer over the first conductive lines, patterning the first insulating layer with vias to expose at least some of the first conductive lines, and depositing a magnetic stack layer over the first insulating layer and exposed first conductive lines. The magnetic stack layer is patterned to form magnetic memory cells and offset conductive lines adapted to couple the exposed first conductive lines to the magnetic memory cells. A second insulating layer is deposited over the magnetic memory cells and offset conductive lines. Vias are formed to expose at least some of the magnetic memory cells, and trenches are formed for conductive lines, within the second insulating layer. The method includes filling the vias and trenches within the second insulating layer with a conductive material. At least one of patterning the magnetic stack layer to form magnetic memory cells and offset conductive lines or forming vias to expose at least some of the magnetic memory cells and forming trenches for conductive lines within the second insulating layer comprise a single etch process.

In another embodiment, a method of manufacturing an MRAM device includes providing a workpiece, depositing a first insulating layer over the workpiece, forming a plurality of first conductive lines within the first insulating layer, and depositing a second insulating layer over the first conductive lines. The method includes patterning the second insulating layer with vias to expose at least some of the first conductive lines, depositing a magnetic stack layer over the second insulating layer and exposed first conductive lines, depositing a first resist over the magnetic stack layer, and patterning and developing the first resist. Portions of the first resist are removed, and a second resist is deposited over the magnetic stack layer and first resist. The second resist is patterned, and the magnetic stack layer is etched in a single etch process to form magnetic memory cells and offset conductive lines adapted to couple the exposed first conductive lines to the magnetic memory cells. The method includes depositing a third insulating layer over the magnetic memory cells and offset conductive lines, forming vias to expose at least some of the magnetic memory cells and forming trenches for conductive lines within the third insulating layer, and filling the vias and trenches within the third insulating layer with a conductive material.

In another embodiment, a method of manufacturing an MRAM device includes providing a workpiece, depositing a first insulating layer over the workpiece, forming a plurality of first conductive lines within the first insulating layer, and depositing a second insulating layer over the first conductive lines. The method includes patterning the second insulating layer with vias to expose at least some of the first conductive lines, and depositing a magnetic stack layer over the second insulating layer and exposed first conductive lines. The magnetic stack layer is patterned to form magnetic memory cells and offset conductive lines adapted to couple the exposed first conductive lines to the magnetic memory cells. A third insulating layer is deposited over the magnetic memory cells and offset conductive lines, a first resist is deposited over the third insulating layer, and the first resist is patterned and developed. The method includes removing portions of the first resist, depositing a second resist over the third insulating layer and the first resist, and patterning the second resist. The third insulating layer is etched in a single etch process to form vias to expose at least some of the magnetic memory cells and form trenches for conductive lines within the third insulating layer. The vias and trenches within the third insulating layer are filled with a conductive material.

Advantages of embodiments of the invention include reducing the number of process steps required to manufacture an offset MRAM device.

BRIEF DESCRIPTION OF THE DRAWINGS

The above features of the present invention will be more clearly understood from consideration of the following descriptions in connection with the accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be described, followed by a discussion of some advantages of embodiments of the present invention.

Figure 1:
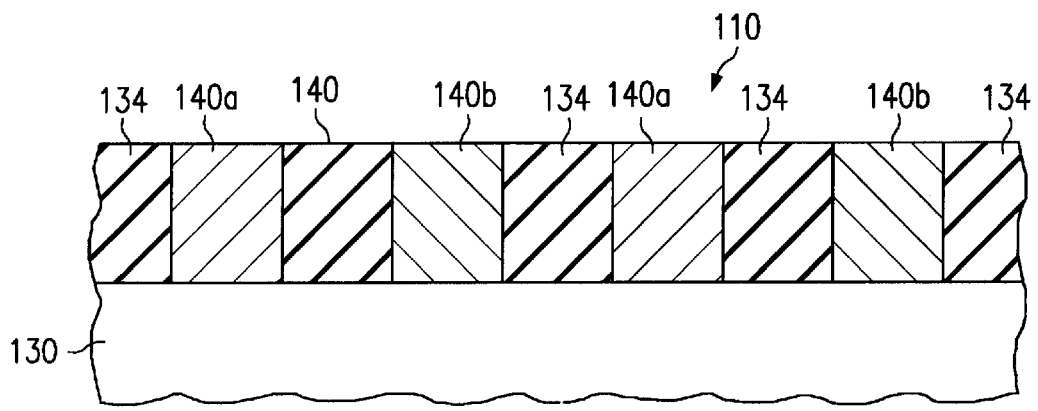
FIGS. 1 through 11 show cross-sectional views of an offset MRAM device in various stages of manufacturing in accordance with embodiments of the present invention.

FIGS. 1 through 11 show cross-sectional views of an offset MRAM device at various stages of fabrication in accordance with an embodiment of the invention. FIG. 1 shows a semiconductor wafer 110 including a workpiece 130. The workpiece 130 may include a semiconductor substrate comprising silicon or other semiconductor materials covered by an insulating layer, for example. The workpiece 130 may also include other active components or circuits formed in the front end of line (FEOL), not shown. The workpiece 130 may comprise silicon oxide over single-crystal silicon, for example. The workpiece 130 may include other conductive layers or other semiconductor elements, e.g. transistors, diodes, etc. Compound semiconductors, GaAs, InP, Si/Ge, or SiC, as examples, may be used in place of silicon.

An optional thin cap layer may be formed over the workpiece 130, not shown. The cap layer may comprise a thin layer of protective material adapted to prevent diffusion of the metal used for first conductive lines 140 into the workpiece 130. For example, if copper is used for the first conductive line 140 material, copper has a tendency to diffuse into underlying and overlying dielectrics unless a cap layer is used. Because copper oxidizes easily, when the first conductive lines 140 comprise copper, preferably, the cap layer comprises a material other than an oxide, to avoid oxidation of first conductive lines 140. The cap layer may comprise a nitride such as $Si_xN_y$, for example, where x and y are integers of 1 or greater, as an example.

A first insulating layer 134 is deposited over the workpiece, or cap layer. The first insulating layer 134 preferably comprises an inter-level dielectric (ILD) layer, e.g., the wafer first inter-level dielectric. The first insulating layer 134 preferably comprises silicon dioxide ($SiO_2$) and may alternatively comprise other dielectric materials such as low dielectric constant materials, for example.

The first insulating layer 134 is patterned, etched, and filled with a conductive material to form first conductive lines 140, preferably in a damascene process, as an example. The pattern and fill process preferably comprises a single damascene, for example. The first insulating layer 134 may be lithographically patterned and reactive ion etch (RIE) to form trenches where first conductive lines 140 will be formed. The trenches may be 0.2 $\mu$m wide and 0.4 to 0.6 $\mu$m deep, as examples.

Depending on the conductive material used, conductive lines 140 may include an optional liner, not shown. For example, if first conductive lines 140 comprise copper, preferably, the liner may comprise a copper liner deposited over the wafer surface within the trenches, including along the trench sidewalls, and a seed layer formed over the copper liner, adapted to improved the deposition of the conductive material. Conductive material, preferably comprising copper, for example, is then deposited over the wafer 110 and within the trenches. First conductive lines 140 may comprise minimum pitched lines (e.g., having the smallest feature size) or larger pitched lines.

First conductive lines 140 may comprise a metal such as copper, and alternatively may comprise other conductive materials such as Al, TiN, Ti, W, combinations thereof, or other conductive materials, deposited by physical vapor deposition (PVD) or chemical vapor deposition (CVD), as examples. Conductive lines 140 in an MRAM preferably comprise copper, which is desirable for its superior conductivity and the ability to use smaller conductive lines because of the improved conductivity of the copper. A damascene process is preferably used to form conductive lines 140 comprising copper, because copper is difficult to etch. First conductive lines 140 may be part of an M1 or M2 metallization layer, as examples.

The wafer 110 is exposed to a chemical/mechanical polish (CMP) to remove excess conductive material from the top of the wafer 110 and form first conductive lines 140, as shown in FIG. 1. First conductive lines 140 include read lines 140a and write lines 140b in accordance with an offset MRAM conductive line 140 pattern. As shown, each read line 140a may be separated from an adjacent read line 140 by a write line 140b.

Figure 2:
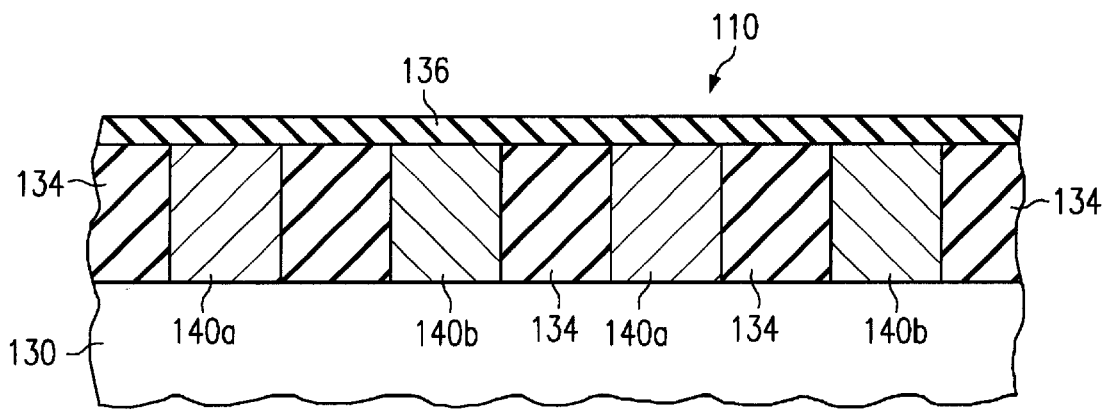

Referring to FIG. 2, a second insulating layer 136 is deposited over the first insulating layer 134 and first conductive lines 140. The second insulating layer 136 is preferably thinner than the first insulating layer 134, and may comprise a thickness of between 30 nm to 200 nm, for example. The second insulating layer 136 may comprise an insulator such as silicon nitride deposited by plasma enhanced chemical vapor deposition (PECVD), for example. Alternatively, other insulating materials may be used for the second insulating layer 136 material.

Figure 3:
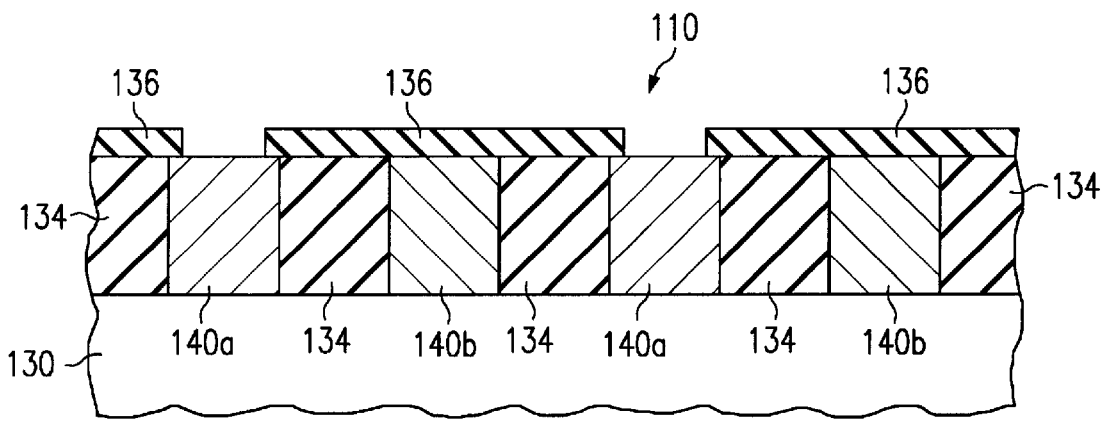

The second insulating layer 136 is patterned using a lithography process to form vias and openings in order to contact to the underlying read lines 140a, as shown in FIG. 3. For example, a reactive ion etch (RIE) may be used to transfer the pattern to the second insulating layer 136.

Alternatively, to form vias and openings to contact the underlying read lines 140a, a metal hard mask (not shown) may be deposited over the second insulating layer 136 prior to the lithography process. A CMP polish may be used to smooth the hard mask, and then the surface of the hard mask may be patterned using lithography. The hard mask, may comprise TaN, Ta, TiN or W, deposited by physical vapor deposition (PVD), for example. The pattern may be transferred to the hard mask by RIE and the resist is stripped. Then, the hard mask pattern is transferred to the second insulating layer 136 using RIE, for example, and the hard mask is then stripped.

Figure 4:
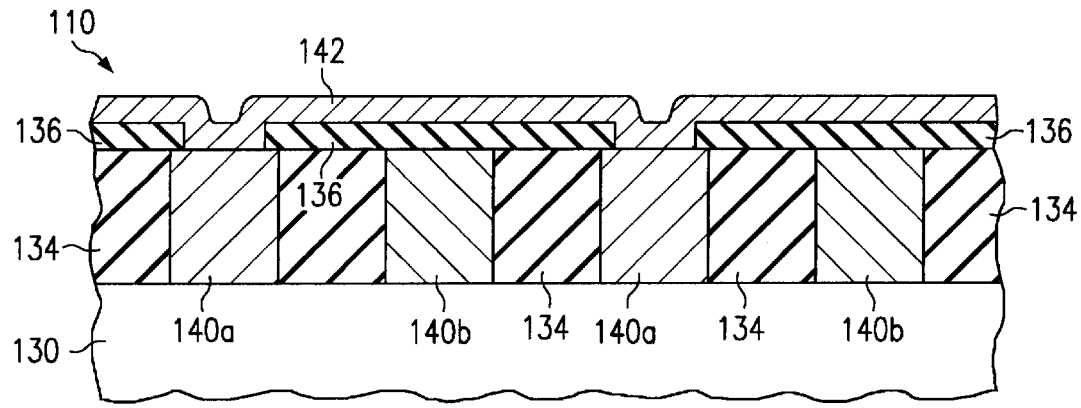
Figure 5:
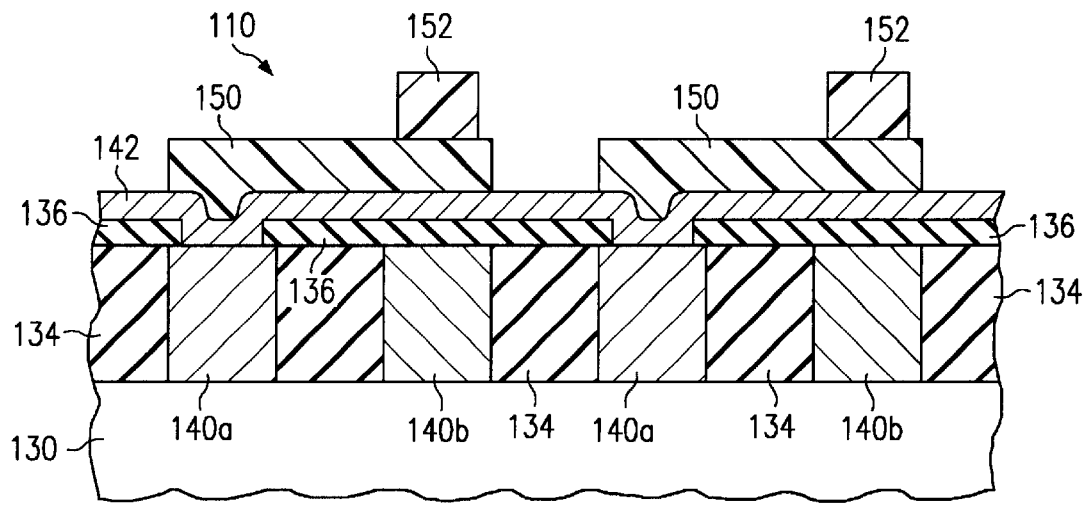

Next, a magnetic stack material 142 layer is deposited or formed over read lines 140a and the second insulating layer 136, as shown in FIG. 4. The magnetic stack material 142 typically comprises a first magnetic layer comprised of a plurality of layers of materials such as PtMn, CoFe, Ru, NiFe, Ni, Co, and/or combinations thereof, using various ratios of these chemical-elements, as examples. Magnetic stack material 142 includes a dielectric layer, comprising aluminum oxide ($Al_2O_3$), for example, deposited over the first magnetic layer. Magnetic stack material 142 also includes a second magnetic layer deposited over the dielectric layer, the second magnetic layer comprising a similar multi-layer structure using similar materials as the first magnetic layer. The various material layers of the magnetic stack may be deposited by PVD, for example.

Figure 6:
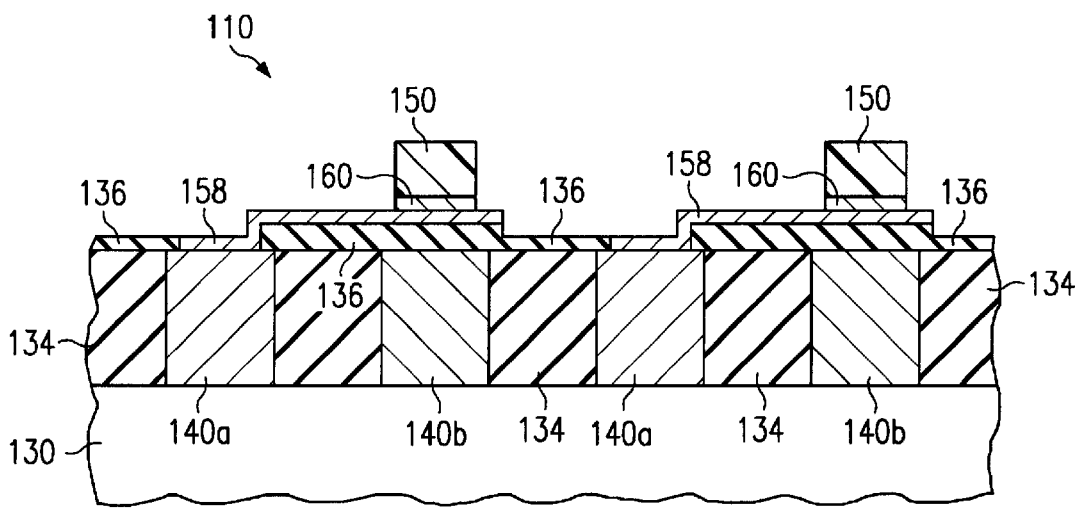

Next, in accordance with an embodiment of the invention, two levels of lithography using both a negative and positive photoresist are used to pattern the magnetic stack material 142 and simultaneously etch the magnetic stack material 142 to form both offset conductive lines 158 and magnetic memory cells 160 (see FIG. 6). Shown in FIG. 5, a first resist 150 is deposited over the magnetic stack material layer 142. The first resist 150 preferably comprises an organic polymer, for example. The first resist 150 preferably comprises a negative photoresist and is used to isolate regions of the magnetic stack material layer 142 that will later form the magnetic memory cells of the MRAM device. In particular, the first resist 150 pattern forms the shape of the offset conducting lines 158 to the read lines 140a.

The first resist 150 is developed, and the undeveloped portion of the first resist 150 is removed. A second resist 152 preferably comprising a positive photoresist is deposited over the wafer 110. The second resist 152 is patterned by lithography, using, for example, a tunnel junction mask. The second resist 152 pattern forms the shape of the magnetic memory cells 160.

A single metal etch process such as RIE or ion milling, as examples, is used to simultaneously transfer both patterns from the first and second resists 150/152 to the magnetic stack material layer 142 to form magnetic memory cells 160 and offset conductive lines 158 to read lines 140a, as shown in FIG. 6. For example, the metal etch process etches through the magnetic stack material layer 142, while the tunnel junction pattern etches part of the magnetic stack material layer 142 and stops on the second insulating layer 136 beneath the magnetic stack material layer 142.

The use of double resists 150/152 to pattern the magnetic stack layer 142 in accordance with embodiments of the present invention, with one resist 150 being a negative resist and the other resist 152 being a positive resist, is advantageous because while two lithography steps are required, only one etch, strip and clean process is required to pattern the magnetic stack layer 142.

Alternatively, a metallization mask lithography process using a positive photoresist may be used to pattern and transfer the pattern to the magnetic stack material layer 142 using an etch process, followed by tunnel junction mask lithography also using positive photoresist and transferring the pattern by an etch process. However, this requires two lithography, two etch, strip and cleaning steps. Therefore, a single metal etch process is preferred because only one etch, strip and cleaning step is required.

Figure 7:
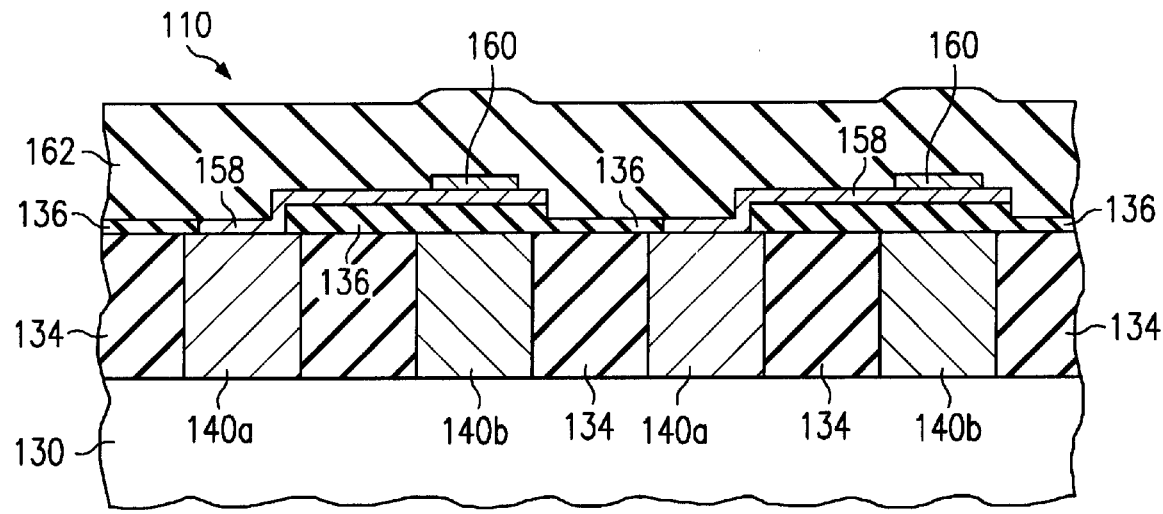

The surface of the wafer 110 is cleaned, e.g., the remaining first resist 150 is removed, and a third insulating layer 162 is deposited, as shown in FIG. 7. The third insulating layer 162 preferably comprises a ILD and may be deposited by PECVD, as an example. The third insulating layer 162 may range in thickness between about 150 nm to 950 nm, for example.

Figure 8:
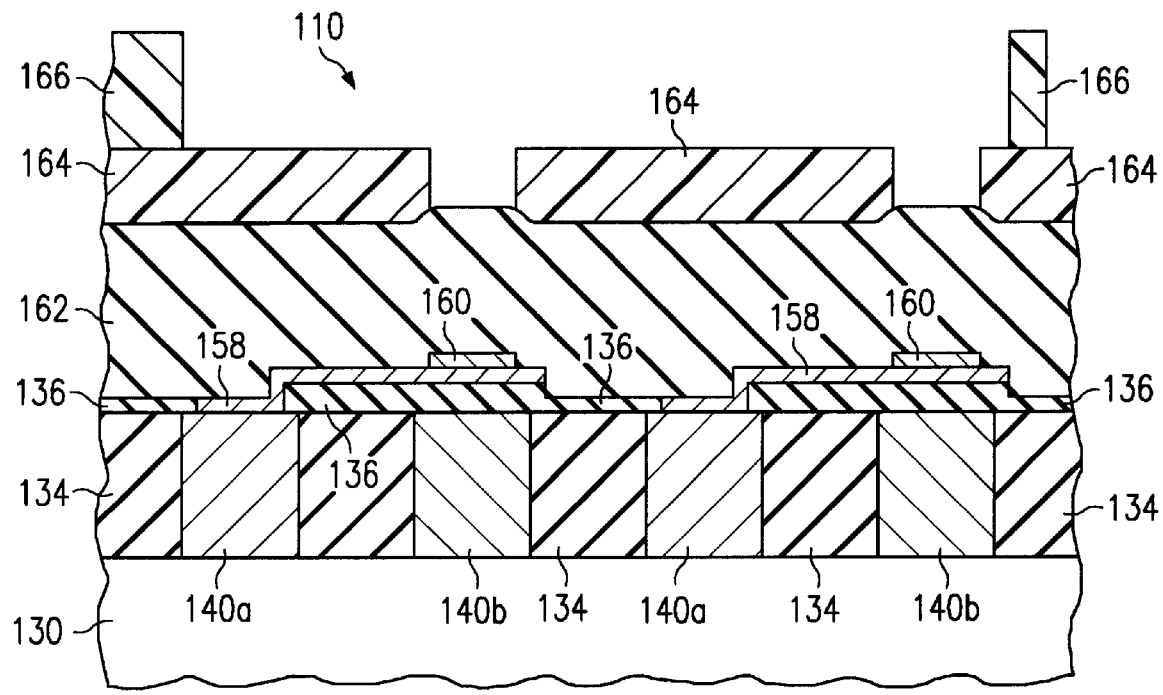

A third resist 164 is deposited over the wafer 110 over the third insulating layer 162, as shown in FIG. 8. The third resist 164 preferably comprises a negative photoresist. The third resist 164 is patterned and developed to form vias 168 that will connect the top of the magnetic memory cells 160 to the metallization layer that will be formed in an overlying conductive line layer.

Figure 9:
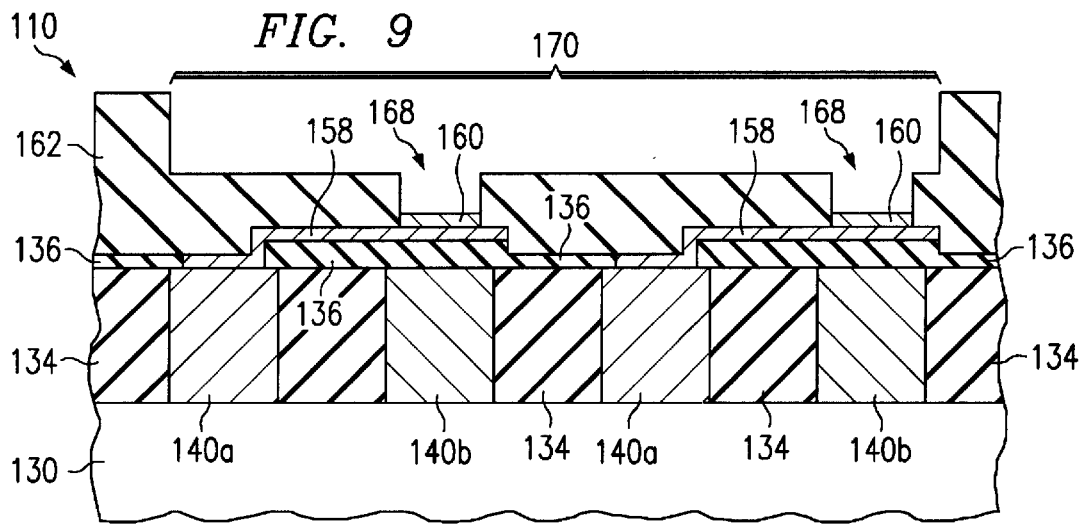

After the third resist 164 is developed, the undeveloped third resist 164 is removed, and a fourth resist 166 is deposited over the third resist 164, as shown. The fourth resist 166 is patterned with the pattern of the next conductive metallization layer, using a mask and lithography. The patterns of both the third and fourth resist 164/166 are simultaneously transferred to the third insulating layer 162, using a single RIE, as shown in FIG. 9, to form vias 168 to underlying magnetic memory cells 160 and patterns for the next metallization layer 170 such as conductive lines. A single RIE is advantageous in that while two lithography steps are required, only one RIE step is required to pattern the third insulating layer 162 with the patterns for both the vias 168 and conductive lines 170.

In an alternative embodiment, the third insulating layer 162 may be patterned in two separate RIE steps, not shown. For example, a positive resist may be deposited and patterned with the via 168 pattern, followed by an RIE process to transfer the via 168 pattern to the third insulating layer 162. Then, the metallization layer 170 lithography is performed by depositing a positive resist, patterning the positive resist with the conductive line 170 pattern, and transferring the metallization pattern 170 to the third insulating layer 162 using RIE, for example. However, a single RIE and double resist 164/166 is preferably used to pattern the third insulating layer 162.

Figure 10:
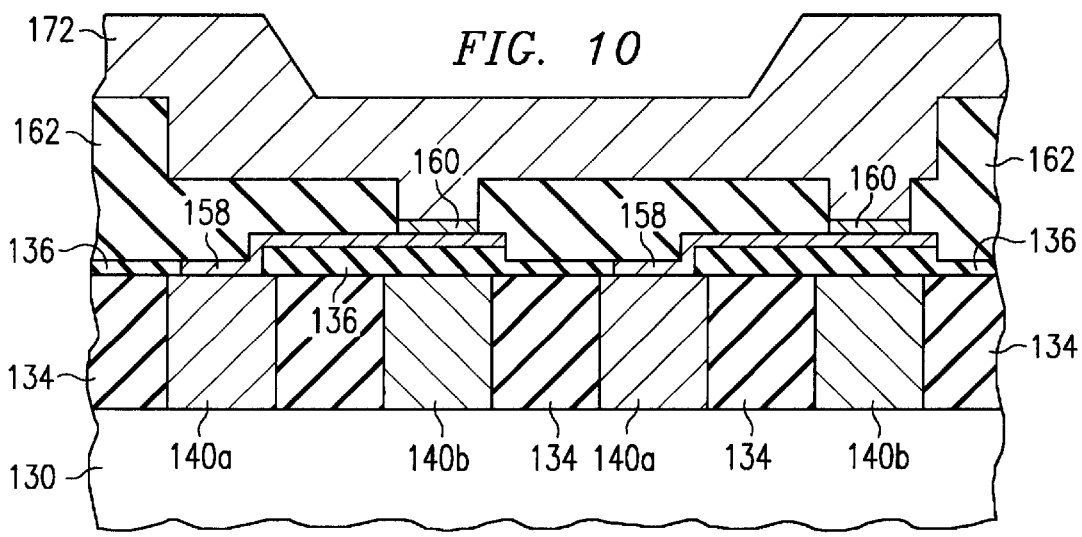

A second conductive material 172 is deposited over the third insulating layer 162, as shown in FIG. 10. The second conductive material 172 fills the trenches for vias 168 and also fills the metallization trenches 170 to form conductive lines. When copper is used as a second conductive material 172, the deposition may include depositing a copper liner which may comprise PVD TaN, CVD TiN, and PVD Ta. The second conductive material 172 deposition process may also include depositing a seed layer, not shown, which may comprise PVD Cu or CVD Cu, as examples. The second conductive material 172 may be filled using copper electroplating, for example. Alternatively, other materials may be used for the second conductive material 172, in accordance with embodiments of the present invention.

Figure 11:
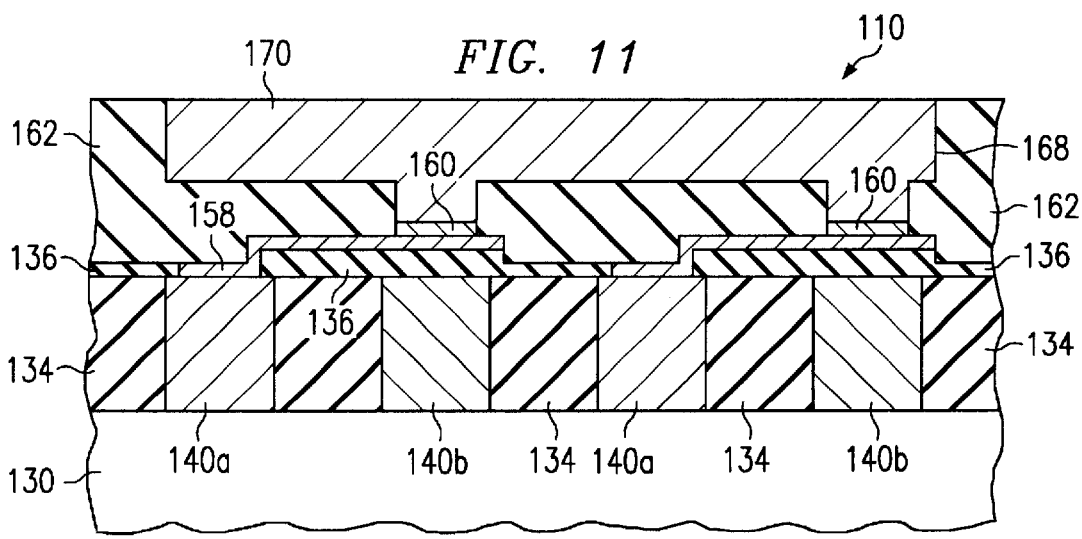

The wafer is exposed to a chemical/mechanical polishing process to remove the second conductive material 172 from the top surface of the wafer 110, as shown in FIG. 11, which forms the upper metallization lines 170.

In accordance with embodiments of the present invention, a double resist (or more particularly, a negative and positive resist) may be used to pattern the magnetic stack material 142, the third insulating layer 162, or both the magnetic stack material 142 and the third insulating layer 162.

Embodiments of the present invention achieve technical advantages as an MRAM device having fewer processing steps to form the magnetic stack material 142, third insulating layer 162, or both. Using the first and second resists 150/152 to pattern the magnetic stack material 142 requires two lithography steps and a single etch, strip and clean process. Using the third and fourth resists 164/166 to pattern the third insulating layer 162 requires two lithography steps and a single RIE step.

Advantages of embodiments of the present invention include providing a simplified process flow for manufacturing offset magnetic memory cells in copper back end of line (BEOL) structures. A series of positive and negative resists are used to pattern the various layers of the structure.

Embodiments of the invention are described with reference to a particular application for an MRAM cell herein; however, embodiments of the invention also have application in other resistive semiconductor devices.

The resist and insulating layers are numbered and referred to herein in the order they are mentioned. The same is true in each claim below. For example, the third and fourth resists 164 and 166 are also referred to in the claims as the first and second resists, respectively.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a resistive semiconductor memory device, comprising:
   forming a plurality of first conductive lines;
   depositing a first insulating layer over the first conductive lines;
   patterning the first insulating layer with vias to expose at least some of the first conductive lines;
   depositing a magnetic stack layer over the first insulating layer and exposed first conductive lines;
   patterning the magnetic stack layer to form magnetic memory cells and offset conductive lines adapted to couple the exposed first conductive lines to the magnetic memory cells;
   depositing a second insulating layer over the magnetic memory cells and offset conductive lines;
   forming vias to expose at least some of the magnetic memory cells and forming trenches for conductive lines within the second insulating layer; and
   filling the vias and trenches within the second insulating layer with a conductive material, wherein at least one of patterning the magnetic stack layer to form magnetic memory cells and offset conductive lines or forming vias to expose at least some of the magnetic memory cells and forming trenches for conductive lines win the second insulating layer comprise a single etch process.

2. The method according to claim 1, wherein patterning the magnetic stack layer to form magnetic memory cells and offset conductive lines comprises:
   depositing a first resist over the magnetic stack layer;
   patterning and developing the first resist;
   removing portions of the first resist;
   depositing a second resist over the magnetic stack layer and first resist;
   patterning the second resist; and
   etching the magnetic stack layer in a single etch process.

3. The method according to claim 2, wherein the first resist comprises a negative resist and the second resist comprises a positive resist.

4. The method according to claim 2, wherein forming vias to expose at least some of the magnetic memory cells and forming trenches for conductive lines within the second insulating layer comprises:
   depositing a third resist over the second insulating layer;
   patterning and developing the third resist;
   removing portions of the third resist;
   depositing a fourth resist over the second insulating layer and the third resist;
   patterning the fourth resist; and
   etching the second insulating layer in a single etch process.

5. The method according to claim 4, wherein the third resist comprises a negative resist and the fourth resist comprises a positive resist.

6. The method according to claim 4, wherein etching the third insulating layer comprises using a reactive ion etch (RIE) etch process.

7. The method according to claim 1, wherein forming the first conductive lines comprises forming the first conductive lines within a third insulating layer.

8. The method according to claim 1, wherein patterning the first insulating layer with vias comprises a reactive ion etch (RIE) process.

9. The method according to claim 1, wherein patterning the first insulating layer with vias comprises:
   depositing a hard mask over the first insulating layer;
   polishing the hard mask surface;
   patterning the hard mask surface; and
   transferring the pattern from the hard mask to the first insulating layer.

10. The method according to claim 1, wherein the resistive semiconductor memory device comprises an offset magnetic random access memory (MRAM) device.

11. The method according to claim 1, wherein forming vias to couple to at least some of the magnetic memory cells and trenches for conductive lines within the second insulating layer comprises:
    depositing a first resist over the second insulating layer;
    patterning and developing the first resist;
    removing portions of the first resist;
    depositing a second resist over the second insulating layer and the first resist;
    patterning the second resist; and
    etching the second insulating layer in a single etch process.

12. A method of manufacturing a magnetic random access memory (MRAM) device, comprising:
    providing a workpiece;
    depositing a first insulating layer over the workpiece;
    forming a plurality of first conductive lines within the first insulating layer;
    depositing a second insulating layer over the first conductive lines;
    patterning the second insulating layer with vias to expose at least some of the first conductive lines;

depositing a magnetic stack layer over the second insulating layer and exposed first conductive lines;

depositing a first resist over the magnetic stack layer;

patterning and developing the first resist;

removing portions of the first resist;

depositing a second resist over the magnetic stack layer and first resist;

patterning the second resist;

etching the magnetic stack layer in a single etch process to form magnetic memory cells and offset conductive lines adapted to couple the exposed first conductive lines to the magnetic memory cells;

depositing a third insulating layer over the magnetic memory cells and offset conductive lines;

forming vias to expose at least some of the magnetic memory cells and forming trenches for conductive lines within the third insulating layer; and filling the vias and trenches within the third insulating layer with a conductive material.

13. The method according to claim 12, wherein the first resist comprises a negative resist and the second resist comprises a positive resist.

14. The method according to claim 12, wherein forming vias to expose at least some of the magnetic memory cells and forming trenches for conductive lines within the second insulating layer comprises:

depositing a third resist over the third insulating layer;

patterning and developing the third resist;

removing portions of the third resist;

depositing a fourth resist over the third insulating layer and the third resist;

patterning the fourth resist; and etching the third insulating layer in a single etch process.

15. The method according to claim 14, wherein the third resist comprises a negative resist and the fourth resist comprises a positive resist.

16. The method according to claim 14, wherein etching the third insulating layer comprises using a reactive ion etch (RIE) etch process.

17. A method of manufacturing a magnetic random access memory (MRAM) device, comprising:

providing a workpiece;

depositing a first insulating layer over the workpiece;

forming a plurality of first conductive lines within the first insulating layer;

depositing a second insulating layer over the first conductive lines;

patterning the second insulating layer with vias to expose at least some of the first conductive lines;

depositing a magnetic stack layer over the second insulating layer and exposed first conductive lines;

patterning the magnetic stack layer to form magnetic memory cells and offset conductive lines adapted to couple the exposed first conductive lines to the magnetic memory cells;

depositing a third insulating layer over the magnetic memory cells and offset conductive lines;

depositing a first resist over the third insulating layer;

patterning and developing the first resist;

removing portions of the first resist;

depositing a second resist over the third insulating layer and the first resist;

patterning the second resist;

etching the third insulating layer in a single etch process to form vias to expose at least some of the magnetic memory cells and forming trenches for conductive lines within the third insulating layer; and filling the vias and trenches within the third insulating layer with a conductive material.

18. The method according to claim 17, wherein the first resist comprises a negative resist and the second resist comprises a positive resist.

19. The method according to claim 18, wherein etching the third insulating layer comprises using a reactive ion etch (RIE) etch process.

20. The method according to claim 17, wherein patterning the magnetic stack layer to form magnetic memory cells and offset conductive lines comprises:

depositing a third resist over the magnetic stack layer;

patterning and developing the third resist;

removing portions of the third resist;

depositing a fourth resist over the magnetic stack layer and third resist;

patterning the fourth resist; and etching the magnetic stack layer in a single etch process.

21. The method according to claim 1, wherein the third resist comprises a negative resist and the fourth resist comprises a positive resist.

* * * * *